United States Patent
Wang et al.

(10) Patent No.: US 9,294,090 B2
(45) Date of Patent: Mar. 22, 2016

(54) CARBON NANOTUBE FIELD-EFFECT TRANSISTOR ENCODER

(71) Applicant: Ningbo University, Ningbo (CN)

(72) Inventors: Pengjun Wang, Ningbo (CN); Weitong Tang, Ningbo (CN); Qian Wang, Ningbo (CN)

(73) Assignee: NINGBO UNIVERSITY, Ningbo (CN)

( * ) Notice: Subject to any disclaimer, the term of this patent is extended or adjusted under 35 U.S.C. 154(b) by 0 days.

(21) Appl. No.: 14/645,447

(22) Filed: Mar. 12, 2015

(65) Prior Publication Data
US 2015/0263729 A1 Sep. 17, 2015

(30) Foreign Application Priority Data
Mar. 12, 2014 (CN) .......................... 2014 1 0089615

(51) Int. Cl.
*H03K 19/00* (2006.01)
*H03K 19/094* (2006.01)
*H03K 19/20* (2006.01)

(52) U.S. Cl.
CPC ...... *H03K 19/0013* (2013.01); *H03K 19/09425* (2013.01); *H03K 19/20* (2013.01)

(58) Field of Classification Search
CPC .................... H03K 19/0013; H03K 19/09425; H03K 19/20
See application file for complete search history.

(56) References Cited

U.S. PATENT DOCUMENTS

| | | | | |
|---|---|---|---|---|
| 2008/0079685 A1* | 4/2008 | Umezaki | ............... | G09G 3/3677 345/100 |
| 2008/0284929 A1* | 11/2008 | Kimura | ............... | G02F 1/13624 349/38 |
| 2009/0094406 A1* | 4/2009 | Ashwood | ............... | G06F 13/404 711/103 |

* cited by examiner

*Primary Examiner* — Jason M Crawford
*Assistant Examiner* — Kurtis R Bahr
(74) *Attorney, Agent, or Firm* — Matthias Scholl, PC; Matthias Scholl

(57) ABSTRACT

A carbon nanotube field-effect transistor encoder, based on a binary circuit which includes: a first inverter, a second inverter, a third inverter, a first three-input NAND gate, a second three-input NAND gate, a third three-input NAND gate, a fourth three-input NAND gate, a fifth three-input NAND gate, a sixth three-input NAND gate, a seventh three-input NAND gate, a first two-input NAND gate, a second two-input NAND gate, a third two-input NAND gate and a two-input AND gate. When the input end of the encoder inputs three-bit binary input signals, the three-bit binary input signals are first processed by the binary circuit; and the processed signals are input into the ternary circuit which includes a first CNFET NAND gate, a second CNFET NAND gate, a first CNFET NOR gate, a second CNFET NOR gate, a fourth inverter and a fifth inverter to be converted into ternary signals for transmission.

3 Claims, 3 Drawing Sheets

CARBON NANOTUBE FIELD-EFFECT TRANSISTOR ENCODER

CROSS-REFERENCE TO RELATED APPLICATIONS

Pursuant to 35 U.S.C. §119 and the Paris Convention Treaty, this application claims the benefit of Chinese Patent Application No. 201410089615.6 filed Mar. 12, 2014, the contents of which are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

1. Field of the Invention

The invention relates to an encoder, in particular to a carbon nanotube field-effect transistor encoder.

2. Description of the Related Art

An encoder is a combinational logic circuit for realizing conversion between different digitals. Due to the high precision, high resolution and high reliability of encoders, encoders are widely used in various encoding operations in industrial automation. At present, integrated chips of encoders are mostly based on the CMOS technology, and adopt binary CMOS gate circuits to realize their functions. With the improving integration level of chips and the reducing technological feature size, defects of the CMOS technology also become obvious, for example, the increment of leakage current, weakening performance and change stability. In addition, binary CMOS gate circuits adopt binary elements, and the quantity of information which is carried by binary signals (0, 1) is small. Therefore, the wiring area of encoder circuits increases, the structure of circuits is complex and the power consumption is large.

Compared to CMOS circuits, CNFETs have huge advantages. Compared to the deep submicron silicon technology, nonmetal carbon nanotubes with the trajectory transmission characteristic at the short-channel length of quasi-one-dimensional structure have smaller leakage currents and channel capacitance. Carbon nanotubes are to roll grapheme pieces into the tubular structure. Single-walled carbon nanotubes can shows metal characteristics and semiconductor characteristics. The good characteristics of carbon nanotubes with semiconductor properties have drawn electronic designers' wide attention. Therefore, in recent years, CNFETs have developed very fast. In the design of some simple circuits such as phase inverters, logic gate circuits and ring oscillators, CNFETs have successfully replaced CMOS circuits and the replacement has proved the availability of CNFETs.

Multi-valued logic circuits (for example, ternary logic circuits) have a large amount of information carried by each arranged wire, a small amount of input and output leads, the higher capacity of carrying information and a higher information density of integrated circuits, which can improve the utilization rate of space and time of circuits and effectively reduce the power consumption and cost of integrated circuits. Therefore, the design of a carbon nanotube field-effect transistor encoder which can convert binary signals into ternary signals is of great significance in improving the integration level of the encoder and reducing the cost and power consumption of the encoder.

SUMMARY OF THE INVENTION

In view of the above-described problems, it is one objective of the invention to provide a carbon nanotube field-effect transistor encoder which has the simple circuit structure, higher integration level and lower cost and power consumption.

The technical proposal for the invention to solve the technical issue is that: a carbon nanotube field-effect transistor encoder comprises a first inverter, a second inverter, a third inverter, a fourth inverter, a fifth inverter, a first three-input NAND gate, a second three-input NAND gate, a third three-input NAND gate, a fourth three-input NAND gate, a fifth three-input NAND gate, a sixth three-input NAND gate, a seventh three-input NAND gate, a first two-input NAND gate, a second two-input NAND gate, a third two-input NAND gate, a two-input AND gate, a first CNFET NAND gate, a second CNFET NAND gate, a first CNFET NOR gate and a second CNFET NOR gate; the input end of the first inverter, the first input end of the first three-input NAND gate, the first input end of the second three-input NAND gate, the first input end of the fourth three-input NAND gate and the first input end of the fifth three-input NAND gate connect, and the connecting end is the first input end of the encoder which is used for accessing the first bit of the three-bit binary signal; the output end of the first inverter, the first input end of the third three-input NAND gate and the first input end of the sixth three-input NAND gate connect; the input end of the second inverter, the second input end of the first three-input NAND gate, the first input end of the two-input AND gate and the second input end of the fourth three-input NAND gate and the second input end of the sixth three-input NAND gate connect, and the connecting end is the second input end of the encoder which is used for accessing the second bit of the three-bit binary signal; the output end of the second inverter, the first input end of the first two-input NAND gate, the second input end of the second three-input NAND gate, the second input end of the third three-input NAND gate and the second input end of the fifth three-input NAND gate connect; the input end of the third inverter, the second input end of the first two-input NAND gate, the second input end of the two-input NAND gate, the third input end of the third three-input NAND gate, the third input end of the fourth three-input NAND gate and the third input end of the fifth three-input NAND gate connect, and the connecting end is the third input end of the encoder which is used for accessing the third bit of the three-bit binary input signal; the output end of the third inverter, the third input end of the first three-input NAND gate, the third input end of the second three-input NAND gate and the third input end of the sixth three-input NAND gate connect; the output end of the first three-input NAND gate and the output end of the first two-input NAND gate are connected with the two input ends of the second two-input NAND gate respectively; the output end of the second three-input NAND gate, the output end of the third three-input NAND gate and the output end of the fourth three-input NAND gate are connected with the three input ends of the seventh three-input NAND gate respectively; the output end of the fifth three-input NAND gate and the output end of the sixth three-input NAND gate are connected with the two input ends of the third two-input NAND gate respectively; the output end of the second two-input NAND gate is connected with the first input end of the first CNFET NAND gate; the output end of the first CNFET NAND gate is connected with the input end of the fourth inverter; the output end of the fourth inverter and the output of the two-input AND gate are connected with the two input ends of the first CNFET NOR gate respectively; the output end of the seventh three-input NAND gate is connected with the first input end of the second CNFET NAND gate; the output end of the second CNFET NAND gate is connected with the input end of the fifth inverter; the output end of the fifth inverter and the output end of the third two-input NAND gate are connected with the two input ends of the CNFET NOR gate respectively; the second input end of the first CNFET NAND gate and the second input end of the second CNFET NAND gate both access voltage signals with amplitude and electrical level corresponding to logic 1; the first inverter, the second inverter, the third inverter, the first three-input NAND gate, the second three-input NAND gate, the third three-input NAND gate, the fourth three-input NAND gate, the fifth three-input NAND gate, the sixth three-input NAND gate, the seventh three-input NAND gate, the first two-input NAND gate, the second two-input NAND gate, the third two-input NAND gate and the two-input AND gate are all binary gate circuits; the fourth inverter and the fifth inverter are both ternary inverters; the first CNFET NAND and the second CNFET NAND gate are both ternary NAND gate circuits; the first CNFET NOR gate and the second CNFET NOR gate are both ternary NOR gate circuits; the output end of the second CNFET NOR gate is the first output end of the encoder which is used for outputting the first bit of the two-bit ternary output signal; and the output end of the CNFET NOR gate is the second output end of the encoder which is used for outputting the second bit of the two-bit ternary output signal.

The first CNFET NAND gate comprises a first CNFET, a second CNFET, a third CNFET, a fourth CNFET, a fifth CNFET, a sixth CNFET, a seven CNFET and an eighth CNFET; the first CNFET, the second CNFET, the third CNFET and the fourth CNFET are all P-type CNFETs; the fifth CNFET, the sixth CNFET, the seventh CNFET and the eighth CNFET are all N-type CNFETs; the source of the first CNFET is connected with the source of the second CNFET, and the connecting end accesses voltage signals with amplitude and electrical level corresponding to logic 1; the source of the third CNFET is connected with the source of the fourth CNFET, and the connecting end accesses voltage signals with amplitude and electrical level corresponding to logic 2; the gate of the first CNFET, the gate of the fourth CNFET, the gate of the fifth CNFET and the gate of the seventh CNFET connect, and the connecting end is the first input end of the first CNFET NAND gate; the gate of the second CNFET, the gate of the third CNFET, the gate of the sixth CNFET and the gate of the eighth CNFET connect, and the connecting end is the second input end of the CNFET NAND gate; the drain of the first CNFET, the drain of the second CNFET and the drain of the fifth CNFET connect; the drain of the fifth CNFET and the source of the sixth CNFET connect; the drain of the third CNFET, the drain of the fourth CNFET, the drain of the sixth CNFET and the drain of the seventh CNFET connect, the connecting end is the output end of the first CNFET NAND gate; the source of the seventh CNFET and the drain of the eighth CNFET connect; the source of the eighth CNFET is earthed; the base electrode of the first CNFET and the base electrode of the second CNFET are both provided with a voltage of −0.9 V; the base electrode of the fifth CNFET and the base electrode of the sixth CNFET are both provided with a voltage of 0.9 V; and the circuit structure of the second CNFET NAND gate and the circuit structure of the first CNFET NAND gate are identical.

The first CNFET NOR gate comprises a ninth CNFET, a tenth CNFET, an eleventh CNFET, a twelfth CNFET, a thirteenth CNFET, a fourteenth, a fifteenth CNFET and a sixth CNFET; the ninth CNFET, the tenth CNFET, the eleventh CNFET and the twelfth CNFET are all P-type CNFETs; the thirteenth CNFET, the fourteenth CNFET, the fifteenth CNFET and the sixteenth CNFET are all N-type CNFETs; the gate of the ninth CNFET, the gate of the tenth CNFET, the gate of the thirteenth CNFET and the gate of the sixteenth CNFET connect, and the connecting end is the first input end of the first CNFET NOR gate; the gate of the eleventh CNFET, the gate of the twelfth CNFET, the gate of the fourteenth CNFET and the gate of the fifteenth CNFET connect, the connecting end is the second input end of the first CNFET NOR gate; the source of the ninth CNFET accesses voltage signals with amplitude and electrical level corresponding to logic 1; the source of the tenth CNFET accesses voltage signals with amplitude and electrical level corresponding to logic 2; the drain of the ninth CNFET is connected with the source of the eleventh CNFET; the drain of the eleventh CNFET, the source of the thirteenth CNFET and the source of the fourteenth CNFET connect; the drain of the tenth CNFET is connected with the source of the twelfth CNFET; the drain of the twelfth CNFET, the drain of the thirteenth CNFET, the drain of the fourteenth CNFET, the drain of the fifteenth CNFET and the drain of the sixteenth CNFET connect, the connecting end is the output end of the first CNFET NOR gate; the source of the fifteenth CNFET and the source of the sixteenth CNFET are both earthed; the base electrode of the ninth CNFET and the base electrode of the eleventh CNFET are both provided with a voltage of −0.9 V; the base electrode of the thirteenth CNFET and the base electrode of the fourteenth CNFET are both provided with a voltage of 0.9 V; and the circuit structure of the second CNFET NOR gate and the circuit structure of the first CNFET NOR gate are identical.

Compared to prior art, the invention has the advantages of that, on the basis of the binary circuit which comprises a first inverter, a second inverter, a third inverter, a first three-input NAND gate, a second three-input NAND gate, a third three-input NAND gate, a fourth three-input NAND gate, a fifth three-input NAND gate, a sixth three-input NAND gate, a seventh three-input NAND gate, a first two-input NAND gate, a second two-input NAND gate, a third two-input NAND gate and a two-input AND gate, when the input end of the encoder inputs three-bit binary input signals, the three-bit binary input signals are first processed by the binary circuit; and the processed signals are input into the ternary circuit which comprises a first CNFET NAND gate, a second CNFET NAND gate, a first CNFET NOR gate, a second CNFET NOR gate, a fourth inverter and a fifth inverter to be converted into ternary signals for transmission. Therefore, the encoder of the invention converts three-bit binary signals into two-bit ternary signals by a binary and ternary hybrid circuit, which not only reduces the amount of leads for external signals in the circuit but also is compatible with existing binary circuits. The circuit has the simple structure, the higher integration level and the lower cost and power consumption.

DESCRIPTION OF THE DRAWINGS

The invention is described hereinbelow with reference to the accompanying drawings, in which.

DETAILED DESCRIPTION OF THE EMBODIMENTS

Technical solution of the invention is illustrated with detailed embodiments hereinbelow, the embodiments, however, should not be explained as limitation of the protection range of the invention.

Example 1

Figure 1:
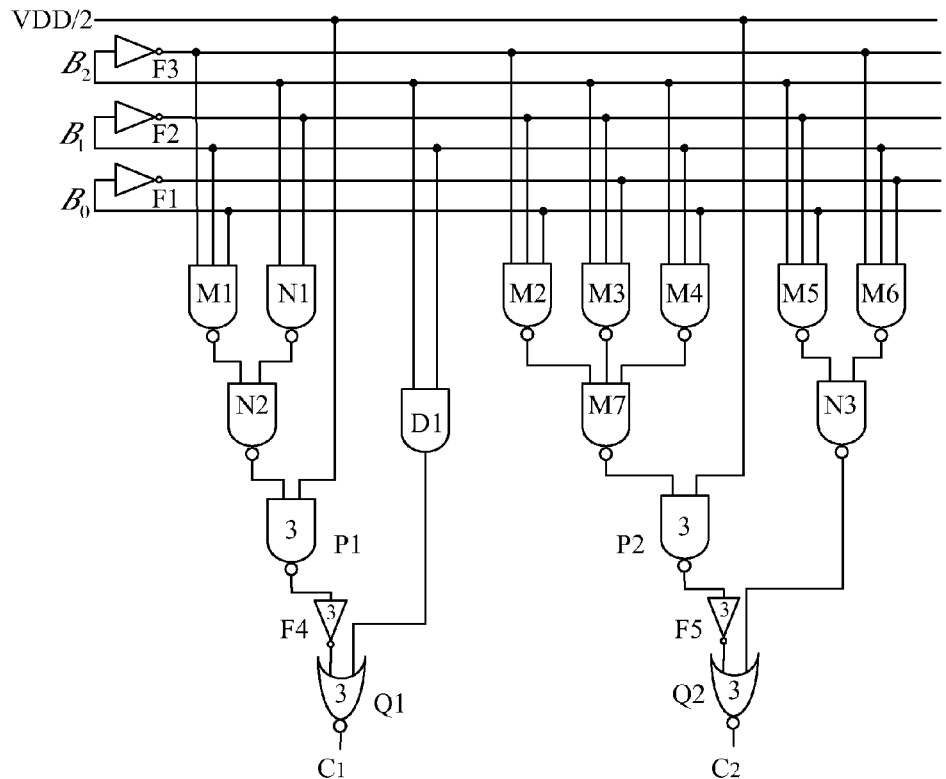
FIG. 1 is a circuit diagram of the invention.

As shown in FIG. 1, a carbon nanotube field-effect transistor encoder comprises a first inverter F1, a second inverter F2, a third inverter F3, a fourth inverter F4, a fifth inverter F5, a first three-input NAND gate M1, a second three-input NAND gate M2, a third three-input NAND gate M3, a fourth three-input NAND gate M4, a fifth three-input NAND gate M5, a sixth three-input NAND gate M6, a seventh three-input NAND gate M7, a first two-input NAND gate N1, a second two-input NAND gate N2, a third two-input NAND gate N3, a two-input AND gate, a first CNFET NAND gate P1, a second CNFET NAND gate P2, a first CNFET NOR gate Q1 and a second CNFET NOR gate Q2; the input end of the first inverter F1, the first input end of the first three-input NAND gate M1, the first input end of the second three-input NAND gate M2, the first input end of the fourth three-input NAND gate M4 and the first input end of the fifth three-input NAND gate M5 connect, and the connecting end is the first input end of the encoder which is used for accessing the first bit $B_0$ of the three-bit binary signal; the output end of the first inverter F1, the first input end of the third three-input NAND gate M3 and the sixth three-input NAND gate M6 connect; the input end of the second inverter F2, the second input end of the first three-input NAND gate M1, the first input end of the two-input AND gate D1 and the second input end of the fourth three-input NAND gate M4 and the second input end of the sixth three-input NAND gate M6 connect, and the connecting end is the second input end of the encoder which is used for accessing the second bit $B_1$ of the three-bit binary signal; the output end of the second inverter F2, the first input end of the first two-input NAND gate N1, the second input end of the second three-input NAND gate M2, the second input end of the third three-input NAND gate M3 and the second input end of the fifth three-input NAND gate M5 connect; the input end of the third inverter F3, the second input end of the first two-input NAND gate N1, the second input end of the two-input NAND gate D1, the third input end of the third three-input NAND gate M3, the third input end of the fourth three-input NAND gate M4 and the third input end of the fifth three-input NAND gate M5 connect, and the connecting end is the third input end of the encoder which is used for accessing the third bit $B_2$ of the three-bit binary input signal; the output end of the third inverter F3, the third input end of the first three-input NAND gate M1, the third input end of the second three-input NAND gate M2 and the third input end of the sixth three-input NAND gate M6 connect; the output end of the first three-input NAND gate M1 and the output end of the first two-input NAND gate N1 are connected with the two input ends of the second two-input NAND gate N2 respectively; the output end of the second three-input NAND gate M2, the output end of the third three-input NAND gate M3 and the output end of the fourth three-input NAND gate M4 are connected with the three input ends of the seventh three-input NAND gate M7 respectively; the output end of the fifth three-input NAND gate M5 and the output of the sixth three-input NAND gate M6 are connected with the two input ends of the third two-input NAND gate N3 respectively; the output end of the second two-input NAND gate N2 is connected with the first input end of the first CNFET NAND gate P1; the output end of the first CNFET NAND gate P1 is connected with the input end of the fourth inverter F4; the output end of the fourth inverter F4 and the output of the two-input AND gate D1 are connected with the two input ends of the first CNFET NOR gate Q1 respectively; the output end of the seventh three-input NAND gate M7 is connected with the first input end of the second CNFET NAND gate P2; the output end of the second CNFET NAND gate P2 is connected with the input end of the fifth inverter F5; the output end of the fifth inverter F5 and the output end of the third two-input NAND gate N3 are connected with the two input ends of the CNFET NOR gate Q2 respectively; the second input end of the first CNFET NAND gate P1 and the second input end of the second CNFET NAND gate P2 both access voltage signals with amplitude and electrical level corresponding to logic 1; the first inverter F1, the second inverter F2, the third inverter F3, the first three-input NAND gate M1, the second three-input NAND gate M2, the third three-input NAND gate M3, the fourth three-input NAND gate M4, the fifth three-input NAND gate M5, the sixth three-input NAND gate M6, the seventh three-input NAND gate M7, the first two-input NAND gate N1, the second two-input NAND gate N2, the third two-input NAND gate N3 and the two-input AND gate D1 are all binary gate circuits; the fourth inverter F4 and the fifth inverter F5 are both ternary inverters; the first CNFET NAND P1 and the second CNFET NAND gate P2 are both ternary NAND gate circuits; the first CNFET NOR gate Q1 and the second CNFET NOR gate Q2 are both ternary NOR gate circuits; the output end of the second CNFET NOR gate Q2 is the first output end of the encoder which is used for outputting the first bit $C_1$ of the two-bit ternary output signal; and the output end of the CNFET NOR gate Q1 is the second output end of the encoder which is used for outputting the second bit $C_2$ of the two-bit ternary output signal.

Figure 2A:
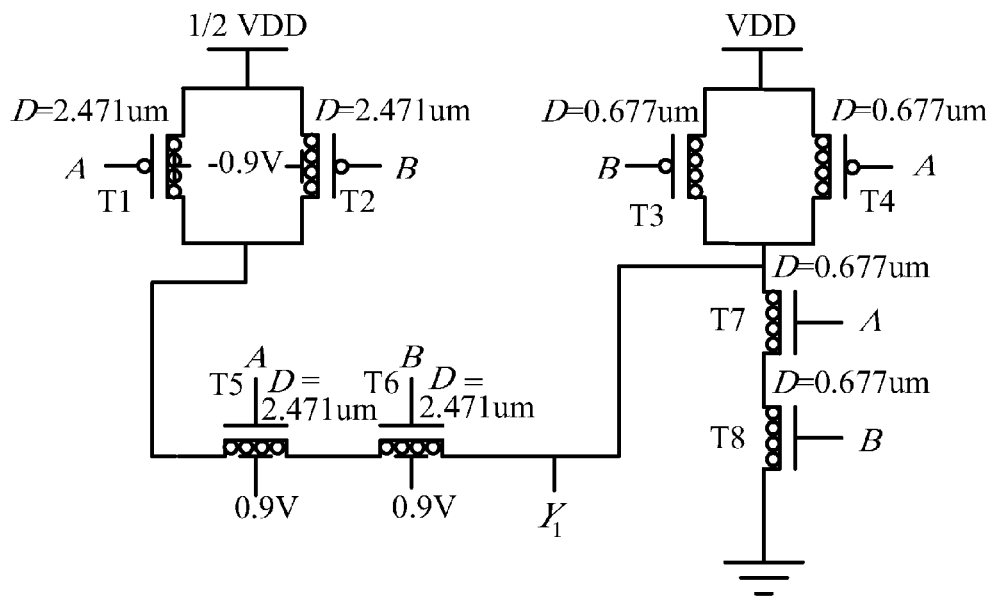
FIG. 2A is a circuit diagram of the first CNFET NAND gate and the second CNFET NAND gate of Example 1.
Figure 2B:
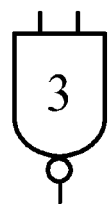
FIG. 2B is a symbol map of the first CNFET NAND gate and the second CNFET NAND gate of Example 1.

As shown in FIG. 2A, in the Embodiment, the first CNFET NAND gate P1 comprises a first CNFET T1, a second CNFET T2, a third CNFET T3, a fourth CNFET T4, a fifth CNFET T5, a sixth CNFET T6, a seven CNFET T7 and an eighth CNFET T8; the first CNFET T1, the second CNFET T2, the third CNFET T3 and the fourth CNFET T4 are all P-type CNFETs; the fifth CNFET T5, the sixth CNFET T6, the seventh CNFET T7 and the eighth CNFET T8 are all N-type CNFETs; the source of the first CNFET T1 is connected with the source of the second CNFET T2, and the connecting end accesses voltage signals with amplitude and electrical level corresponding to logic 1; the source of the third CNFET T3 is connected with the source of the fourth CNFET T4, and the connecting end accesses voltage signals with amplitude and electrical level corresponding to logic 2; the gate of the first CNFET T1, the gate of the fourth CNFET T4, the gate of the fifth CNFET T5 and the gate of the seventh CNFET T7 connect, and the connecting end is the first input end of the first CNFET NAND gate P1; the gate of the second CNFET T2, the gate of the third CNFET T3, the gate of the sixth CNFET T6 and the gate of the eighth CNFET T8 connect, and the connecting end is the second input end of the CNFET NAND gate P1; the drain of the first CNFET T1, the drain of the second CNFET T2 and the drain of the fifth CNFET T5 connect; the drain of the fifth CNFET T5 and the source of the sixth CNFET T6 connect; the drain of the third CNFET T3, the drain of the fourth CNFET T4, the drain of the sixth CNFET T6 and the drain of the seventh CNFET T7 connect, the connecting end is the output end of the first CNFET NAND gate P1; the source of the seventh CNFET T7 and the drain of the eighth CNFET T8 connect; the source of the eighth CNFET T8 is earthed; the base electrode of the first CNFET T1 and the base electrode of the second CNFET T2 are both provided with a voltage of −0.9 V; the base electrode of the fifth CNFET T5 and the base electrode of the sixth CNFET T6 are both provided with a voltage of 0.9 V; and the circuit structure of the second CNFET NAND gate P2 and the circuit structure of the first CNFET NAND gate P1 are identical. The symbol map of the first CNFET NAND P1 and the second CNFET NAND P2 is shown in FIG. 2B.

Figure 3A:
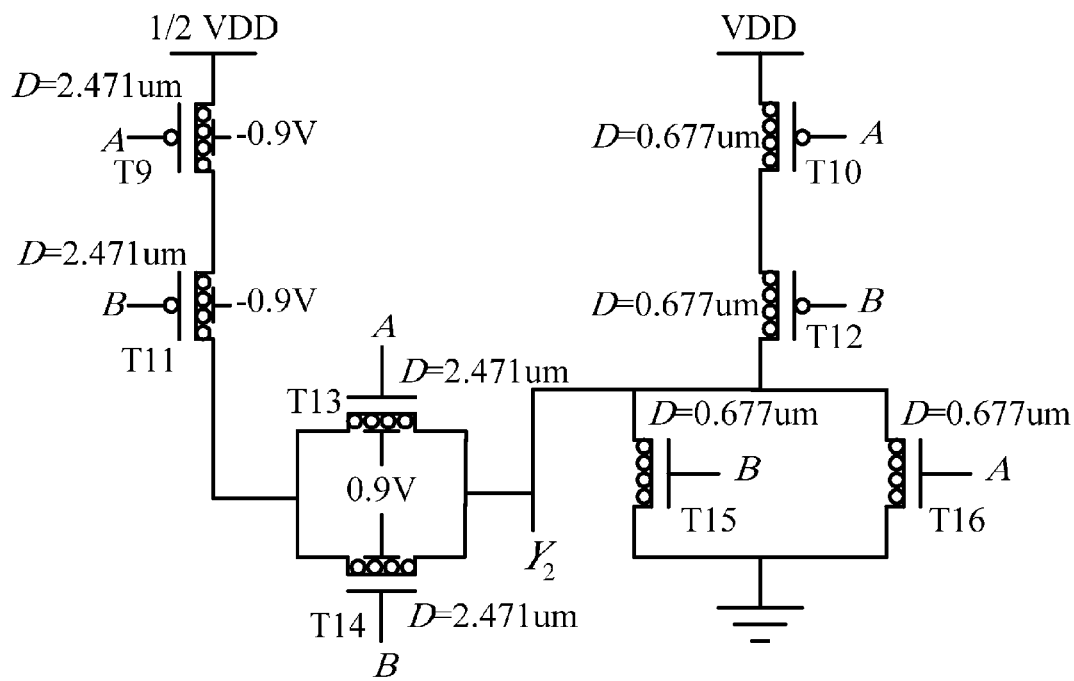
FIG. 3A is a circuit diagram of the first CNFET NOR gate and the second CNFET NOR gate of Example 1.
Figure 3B:
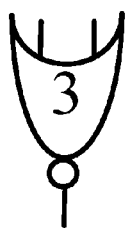
FIG. 3B is a symbol map of the first CNFET NOR gate and the second CNFET NOR gate of Example 1.

As shown in FIG. 3A, in the Embodiment, the first CNFET NOR gate Q1 comprises a ninth CNFET T9, a tenth CNFET T10, an eleventh CNFET T11, a twelfth CNFET T12, a thirteenth CNFET T13, a fourteenth T14, a fifteenth CNFET T15 and a sixth CNFET T16; the ninth CNFET T9, the tenth CNFET T10, the eleventh CNFET T11 and the twelfth CNFET T12 are all P-type CNFETs; the thirteenth CNFET T13, the fourteenth CNFET T14, the fifteenth CNFET T15 and the sixteenth CNFET T16 are all N-type CNFETs; the gate of the ninth CNFET T9, the gate of the tenth CNFET T10, the gate of the thirteenth CNFET T13 and the gate of the sixteenth CNFET T16 connect, and the connecting end is the first input end of the first CNFET NOR gate Q1; the gate of the eleventh CNFET T11, the gate of the twelfth CNFET T12, the gate of the fourteenth CNFET T14 and the gate of the fifteenth CNFET T15 connect, the connecting end is the second input end of the first CNFET NOR gate Q1; the source of the ninth CNFET T9 accesses voltage signals with amplitude and electrical level corresponding to logic 1; the source of the tenth CNFET T10 accesses voltage signals with amplitude and electrical level corresponding to logic 2; the drain of the ninth CNFET T9 is connected with the source of the eleventh CNFET T11; the drain of the eleventh CNFET T11, the source of the thirteenth CNFET T13 and the source of the fourteenth CNFET T14 connect; the drain of the tenth CNFET T10 is connected with the source of the twelfth CNFET T12; the drain of the twelfth CNFET T12, the drain of the thirteenth CNFET T13, the drain of the fourteenth CNFET T14, the drain of the fifteenth CNFET T15 and the drain of the sixteenth CNFET T16 connect, the connecting end is the output end of the first CNFET NOR gate Q1; the source of the fifteenth CNFET T15 and the source of the sixteenth CNFET T16 are both earthed; the base electrode of the ninth CNFET T9 and the base electrode of the eleventh CNFET T11 are both provided with a voltage of −0.9 V; the base electrode of the thirteenth CNFET T13 and the base electrode of the fourteenth CNFET T14 are both provided with a voltage of 0.9 V; and the circuit structure of the second CNFET NOR gate Q2 and the circuit structure of the first CNFET NOR gate Q2 are identical as shown in FIG. 3B.

In the Embodiment, the first inverter F1, the second inverter F2, the third inverter F3, the first three-input NAND gate M1, the second three-input NAND gate M2, the third three-input NAND gate M3, the fourth three-input NAND gate M4, the fifth three-input NAND gate M5, the sixth three-input NAND gate M6, the seventh three-input NAND gate M7, the first two-input NAND gate N1, the second two-input NAND gate N2, the third two-input NAND gate N3 and the two-input AND gate D1 can adopt mature products in the technical field; and the fourth inverter F4 and the fifth inverter F5 can adopt the ternary inverter which is disclosed in the literature of Nan H, Ken C. Novel ternary logic design based on CNFET[C]. SoC Design Conference, 2010:115-118.

The design process of the encoder of the Embodiment is that: the encoder of the Embodiment now converts binary signals into ternary signals and uses two ternary signals to represent three binary signals. Wherein, when $C_2 C_1 = 22$, the codes are redundant codes and the redundancy is 11.1%. The code table of the encoder of the Embodiment is shown in FIG. 1.

| FIG. 1 Code Table | | | | |
|---|---|---|---|---|
| $C_2$ | $C_1$ | $B_2$ | $B_1$ | $B_0$ |
| 0 | 0 | 0 | 0 | 0 |
| 0 | 1 | 0 | 0 | 2 |
| 0 | 2 | 0 | 2 | 0 |
| 1 | 0 | 0 | 2 | 2 |
| 1 | 1 | 2 | 0 | 0 |
| 1 | 2 | 2 | 0 | 2 |
| 2 | 0 | 2 | 2 | 0 |
| 2 | 1 | 2 | 2 | 2 |

Figure 4:
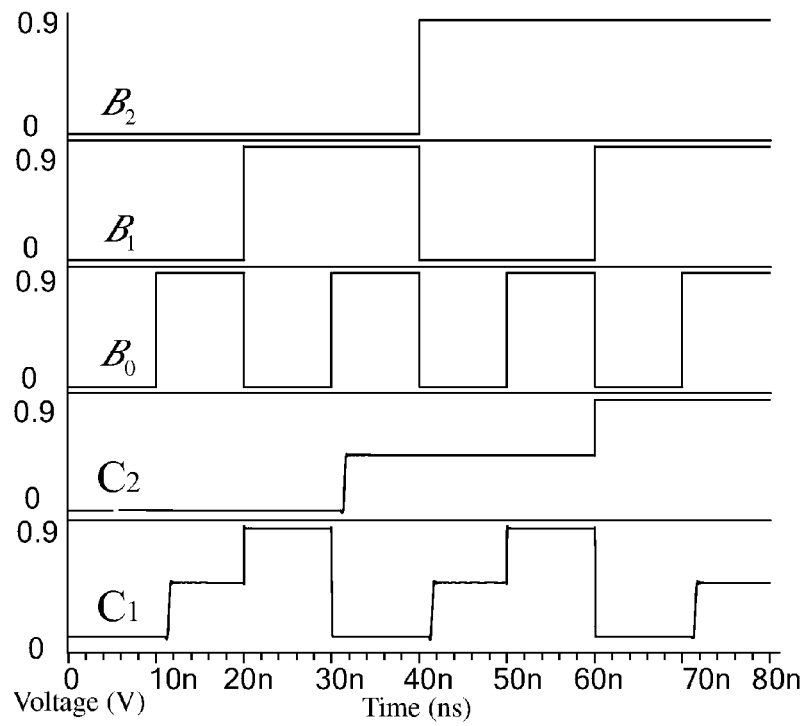
FIG. 4 is a simulation oscillogram of Example 1.

In FIG. 1, $C_2$ and $C_1$ represent two-bit ternary signals respectively; $B_2$, $B_1$ and $B_0$ represent three-bit binary signals respectively. In order to convert the three-bit binary signals $B_2$, $B_1$ and $B_0$ into two-bit ternary signals $C_2$ and $C_1$ through encoding, according to the encoding method of FIG. 4, we can get:

$$C_2 = (B_2\overline{B_1 B_0} + B_2\overline{B_1}B_0 + \overline{B_2}B_1 B_0) \cdot 1 + B_2 B_1 B_0 + B_2 B_1 \overline{B_0} \quad (1)$$
$$= (B_2\overline{B_1} + \overline{B_2}B_1 B_0) \cdot 1 + B_2 B_1$$

$$C_1 = (\overline{B_2 B_1}B_0 + B_2\overline{B_1 B_0} + B_2 B_1 B_0) \cdot 1 + \overline{B_2 B_1 B_0} + B_2\overline{B_1}B_0. \quad (2)$$

Through the equations (1) and (2), we get the simplest forms of ternary signals $C_2$ and $C_1$. Combined with ternary and binary NAND and NOR circuits, we get the encoder circuit of the Embodiment as shown in FIG. 1.

Example 2

Example 1 and Example 2 are basically identical. The difference is just that, in Example 2, the first CNFET NAND gate P1, the second CNFET NAND gate P2, the first CNFET NOR gate Q1 and the second CNFET NOR Q2 adopt the ternary NAND and NOR circuits which are disclosed in the literature Moaiyeri M H, Doostaregan A, Navi K. Design of Energy-efficient and Robust Ternary Circuits for Nanotechnology [J]. Circuits, Devices & Systems, IET, 2011, 5(4): 285-296. The ternary NAND and NOR circuits in the literature make the logic outputs of NTI and PTI string together through two CNFETs to get standard logic NAND and NOR gates.

Figure 5:
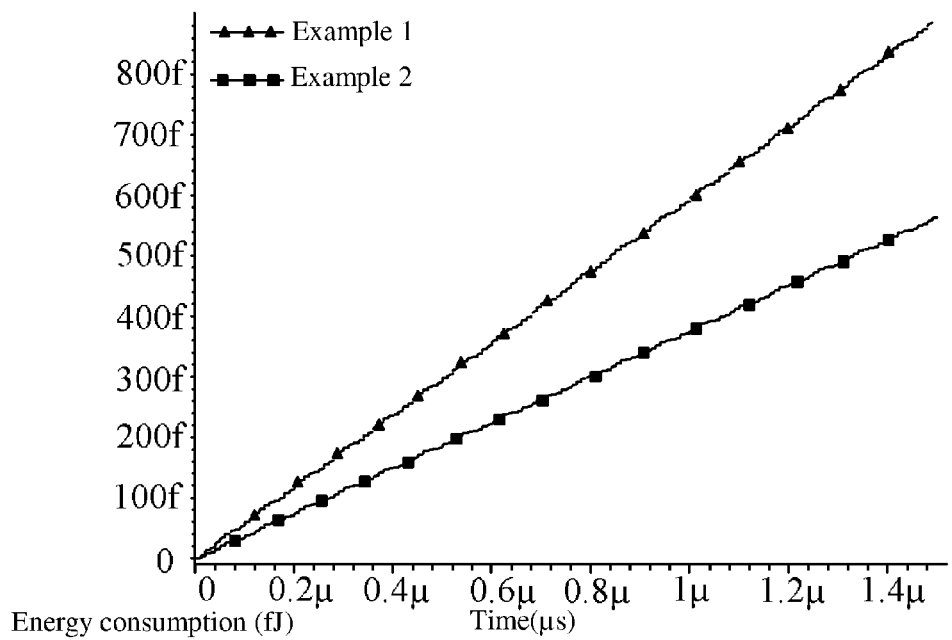
FIG. 5 is a comparison diagram of energy consumption of Example 1 and Example 2.

Under the condition of the same technological parameters, when the load capacitance is 10 fF, the energy consumption comparison is conducted between the encoder of Example 1 and the encoder of Example 2, and the comparison diagram of the energy consumption of the encoders is shown in FIG. 5. According to the analysis of FIG. 5, compared to the encoder in Example 2, the encoder in Example 1 saves 36.9% of energy consumption. According to the analysis, the reason is that: when the ternary NAND and NOR circuits in Example 2 transmit the logic level 1, the two CNFETs in the middle play a role of voltage division, which cause larger loss of energy consumption. However, the first CNFET NAND gate P1, the second CNFET NAND P2, the first CNFET NOR gate Q1 and the second CNFET NOR Q2 in Example 1 don't cause loss of energy consumption. The encoder of Example 2 has the obvious characteristic of low power consumption.

The invention claimed is:

1. A carbon nanotube field-effect transistor encoder, comprising a first inverter, a second inverter, a third inverter, a fourth inverter, a fifth inverter, a first three-input NAND gate, a second three-input NAND gate, a third three-input NAND gate, a fourth three-input NAND gate, a fifth three-input NAND gate, a sixth three-input NAND gate, a seventh three-input NAND gate, a first two-input NAND gate, a second two-input NAND gate, a third two-input NAND gate, a two-input AND gate, a first CNFET NAND gate, a second CNFET NAND gate, a first CNFET NOR gate, and a second CNFET NOR gate, wherein:

an input end of the first inverter, a first input end of the first three-input NAND gate, the first input end of the second three-input NAND gate, the first input end of the fourth three-input NAND gate, and the first input end of the fifth three-input NAND gate connect, and a connecting end is the first input end of the encoder which is used for accessing a first bit of a three-bit binary signal;

an output end of the first inverter, a first input end of the third three-input NAND gate, and the first input end of the sixth three-input NAND gate connect;

the input end of the second inverter, a second input end of the first three-input NAND gate, the first input end of the two-input AND gate, the second input end of the fourth three-input NAND gate, and the second input end of the sixth three-input NAND gate connect, and the connecting end is the second input end of the encoder which is used for accessing a second bit of the three-bit binary signal;

the output end of the second inverter, the first input end of the first two-input NAND gate, the second input end of the second three-input NAND gate, the second input end of the third three-input NAND gate, and the second input end of the fifth three-input NAND gate connect;

the input end of the third inverter, the second input end of the first two-input NAND gate, the second input end of the two-input AND gate, a third input end of the third three-input NAND gate, the third input end of the fourth three-input NAND gate, and the third input end of the fifth three-input NAND gate connect, and the connecting end is the third input end of the encoder which is used for accessing a third bit of the three-bit binary input signal;

the output end of the third inverter, the third input end of the first three-input NAND gate, the third input end of the second three-input NAND gate, and the third input end of the sixth three-input NAND gate connect;

the output end of the first three-input NAND gate and the output end of the first two-input NAND gate are connected with the two input ends of the second two-input NAND gate respectively;

the output end of the second three-input NAND gate, the output end of the third three-input NAND gate, and the output end of the fourth three-input NAND gate are connected with the three input ends of the seventh three-input NAND gate respectively;

the output end of the fifth three-input NAND gate and the output end of the sixth three-input NAND gate are connected with the two input ends of the third two-input NAND gate respectively;

the output end of the second two-input NAND gate is connected with the first input end of the first CNFET NAND gate;

the output end of the first CNFET NAND gate is connected with the input end of the fourth inverter;

the output end of the fourth inverter and the output of the two-input AND gate are connected with the two input ends of the first CNFET NOR gate respectively;

the output end of the seventh three-input NAND gate is connected with the first input end of the second CNFET NAND gate;

the output end of the second CNFET NAND gate is connected with the input end of the fifth inverter;

the output end of the fifth inverter and the output end of the third two-input NAND gate are connected with the two input ends of the CNFET NOR gate respectively;

the second input end of the first CNFET NAND gate and the second input end of the second CNFET NAND gate both access voltage signals with amplitude and electrical level corresponding to logic 1;

the first inverter, the second inverter, the third inverter, the first three-input NAND gate, the second three-input NAND gate, the third three-input NAND gate, the fourth three-input NAND gate, the fifth three-input NAND gate, the sixth three-input NAND gate, the seventh three-input NAND gate, the first two-input NAND gate, the second two-input NAND gate, the third two-input NAND gate, and the two-input AND gate are all binary gate circuits;

the fourth inverter and the fifth inverter are both ternary inverters;

the first CNFET NAND and the second CNFET NAND gate are both ternary NAND gate circuits;

the first CNFET NOR gate and the second CNFET NOR gate are both ternary NOR gate circuits;

the output end of the first CNFET NOR gate is the first output end of the encoder which is used for outputting the first bit of the two-bit ternary output signal; and the output end of the second CNFET NOR gate is the second output end of the encoder which is used for outputting the second bit of the two-bit ternary output signal.

2. The carbon nanotube field-effect transistor encoder of claim 1, wherein:

the first CNFET NAND gate comprises a first CNFET, a second CNFET, a third CNFET, a fourth CNFET, a fifth CNFET, a sixth CNFET, a seven CNFET, and an eighth CNFET;

the first CNFET, the second CNFET, the third CNFET, and the fourth CNFET are all P-type CNFETs;

the fifth CNFET, the sixth CNFET, the seventh CNFET, and the eighth CNFET are all N-type CNFETs;

the source of the first CNFET is connected with the source of the second CNFET, and the connecting end accesses voltage signals with amplitude and electrical level corresponding to logic 1;

the source of the third CNFET is connected with the source of the fourth CNFET, and the connecting end accesses voltage signals with amplitude and electrical level corresponding to logic 2;

the gate of the first CNFET, the gate of the fourth CNFET, the gate of the fifth CNFET, and the gate of the seventh CNFET connect, and the connecting end is the first input end of the first CNFET NAND gate;

the gate of the second CNFET, the gate of the third CNFET, the gate of the sixth CNFET, and the gate of the eighth CNFET connect, and the connecting end is the second input end of the CNFET NAND gate;

the drain of the first CNFET, the drain of the second CNFET, and the source of the fifth CNFET connect;

the drain of the fifth CNFET and the source of the sixth CNFET connect;

the drain of the third CNFET, the drain of the fourth CNFET, the drain of the sixth CNFET, and the drain of the seventh CNFET connect, the connecting end is the output end of the first CNFET NAND gate;

the source of the seventh CNFET and the drain of the eighth CNFET connect;

the source of the eighth CNFET is earthed;

the base electrode of the first CNFET and the base electrode of the second CNFET are both provided with a voltage of −0.9 V;

the base electrode of the fifth CNFET and the base electrode of the sixth CNFET are both provided with a voltage of 0.9 V; and the circuit structure of the second CNFET NAND gate and the circuit structure of the first CNFET NAND gate are identical.

3. A carbon nanotube field-effect transistor encoder of claim 2, wherein:

the first CNFET NOR gate comprises a ninth CNFET, a tenth CNFET, an eleventh CNFET, a twelfth CNFET, a thirteenth CNFET, a fourteenth, a fifteenth CNFET, and a sixteenth CNFET;

the ninth CNFET, the tenth CNFET, the eleventh CNFET, and the twelfth CNFET are all P-type CNFETs;

the thirteenth CNFET, the fourteenth CNFET, the fifteenth CNFET, and the sixteenth CNFET are all N-type CNFETs;

the gate of the ninth CNFET, the gate of the tenth CNFET, the gate of the thirteenth CNFET, and the gate of the sixteenth CNFET connect, and the connecting end is the first input end of the first CNFET NOR gate;

the gate of the eleventh CNFET, the gate of the twelfth CNFET, the gate of the fourteenth CNFET, and the gate of the fifteenth CNFET connect, the connecting end is the second input end of the first CNFET NOR gate;

the source of the ninth CNFET accesses voltage signals with amplitude and electrical level corresponding to logic 1;

the source of the tenth CNFET accesses voltage signals with amplitude and electrical level corresponding to logic 2;

the drain of the ninth CNFET is connected with the source of the eleventh CNFET;

the drain of the eleventh CNFET, the source of the thirteenth CNFET, and the source of the fourteenth CNFET connect;

the drain of the tenth CNFET is connected with the source of the twelfth CNFET;

the drain of the twelfth CNFET, the drain of the thirteenth CNFET, the drain of the fourteenth CNFET, the drain of the fifteenth CNFET, and the drain of the sixteenth CNFET connect, the connecting end is the output end of the first CNFET NOR gate;

the source of the fifteenth CNFET and the source of the sixteenth CNFET are both earthed;

the base electrode of the ninth CNFET and the base electrode of the eleventh CNFET are both provided with a voltage of −0.9 V;

the base electrode of the thirteenth CNFET and the base electrode of the fourteenth CNFET are both provided with a voltage of 0.9 V;

and the circuit structure of the second CNFET NOR gate and the circuit structure of the first CNFET NOR gate are identical.

* * * * *